United States Patent
Kumar et al.

(10) Patent No.: US 12,028,088 B2
(45) Date of Patent: Jul. 2, 2024

(54) ANALOGUE-TO-DIGITAL CONVERTER CIRCUITRY

(71) Applicant: Socionext Inc., Kanagawa (JP)

(72) Inventors: Jayaraman Kumar, Maidenhead (GB); Kenneth Stephen Hunt, Maidenhead (GB)

(73) Assignee: SOCIONEXT INC., Kanagawa (JP)

(*) Notice: Subject to any disclaimer, the term of this patent is extended or adjusted under 35 U.S.C. 154(b) by 199 days.

(21) Appl. No.: 17/850,235

(22) Filed: Jun. 27, 2022

(65) Prior Publication Data

US 2023/0029901 A1 Feb. 2, 2023

(30) Foreign Application Priority Data

Jul. 28, 2021 (EP) .................................. 21188217

(51) Int. Cl.
*H03M 1/38* (2006.01)
*H03M 1/06* (2006.01)
*H03M 1/18* (2006.01)
*H03M 1/46* (2006.01)

(52) U.S. Cl.
CPC ........... *H03M 1/38* (2013.01); *H03M 1/0697* (2013.01); *H03M 1/183* (2013.01); *H03M 1/462* (2013.01); *H03M 1/468* (2013.01)

(58) Field of Classification Search
CPC ...... H03M 1/38; H03M 1/0697; H03M 1/462; H03M 1/468; H03M 1/183
USPC ................................ 341/155, 161, 163, 172
See application file for complete search history.

(56) References Cited

U.S. PATENT DOCUMENTS

| | | | |
|---|---|---|---|
| 6,765,520 B1 | 7/2004 | Chuang et al. | |
| 8,587,466 B2* | 11/2013 | Debnath | H03M 1/145 341/163 |
| 9,154,152 B1* | 10/2015 | Chiu | H03M 1/468 |
| 10,256,802 B1 | 4/2019 | Vaz | |
| 2019/0319444 A1 | 10/2019 | Westra et al. | |

OTHER PUBLICATIONS

Extended European Search Report dated Jan. 21, 2022 issued in the corresponding European Patent Application No. 21188217.0.

(Continued)

*Primary Examiner* — Khai M Nguyen
(74) *Attorney, Agent, or Firm* — Rimon P.C.

(57) ABSTRACT

Analogue-to-digital converter, ADC, circuitry, including: an analogue input terminal; a comparator having first and second comparator-input terminals; and successive-approximation control circuitry to apply a potential difference across the first and second comparator-input terminals based on an input voltage signal, and to control the potential difference for a series of successive approximation operations to cause the comparator to test in each successive approximation operation whether a magnitude of an analogue input voltage signal is larger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation.

14 Claims, 10 Drawing Sheets

(56) References Cited

OTHER PUBLICATIONS

Ramgopal Sekar. "Southern Illinois University Carbondale OpenSIUC Theses and Dissertations Low-Power Techniques for Successive Approximation Register (SAR) Analog-To-Digital Converters" Jan. 8, 2010 (Jan. 8, 2010), XP055188723, Retrieved from the Internet: URL:http://opensiuc.lib.siu.edu/cgi/viewcontent.cgi?article=1357&context-theses [retrieved on May 12, 2015].

Hun-Cheng Liu et al: "A 10b I00MS/s 1.13mW SAR ADC with binary-scaled error compensation" Solid-State Circuits Conference Digest of Technical Papers (ISSCC), 2010 IEEE International, IEEE, Piscataway, NJ, USA, Feb. 7, 2010 (Feb. 7, 2010), pp. 386-387, XP031650055, ISBN: 978-1-4244-6033-5.

* cited by examiner

ANALOGUE-TO-DIGITAL CONVERTER CIRCUITRY

CROSS-REFERENCE OF RELATED APPLICATIONS

This application claims the benefit of European Patent Application No. 21188217.0, filed on Jul. 28, 2021, the entire disclosure of which Application is incorporated by reference herein.

The present invention relates to analogue-to-digital converter (ADC) circuitry. In particular, the present invention relates to ADC circuitry configured to use particular successive approximation results (amongst a series of successive approximation results) to determine when a magnitude of an analogue input voltage signal is outside a full-scale range of the ADC (i.e. overvoltage detection). More generally, such ADC circuitry uses particular successive approximation results to determine when a defined condition has been met.

A successive approximation register (SAR) ADC typically uses a comparator in each of its successive approximation (sub-conversion) operations. Successive-approximation conversion may be considered as one example of a conversion process which is made up of a sequence of such sub-conversion operations.

By way of background, conventional SAR ADC circuitry 100 illustrated in FIG. 1 will now be discussed. The main elements of the SAR ADC circuitry 100 are a S/H (Sample/Hold—or sampler) circuit 110 to acquire an analogue input signal $V_{IN}$ from external circuitry (not shown), a voltage comparator 120, an internal DAC 130 and an SAR 140. It will be appreciated that the arrangement of elements in FIG. 1 is a simple example to aid in an overview understanding of the functionality of SAR ADC circuitry. However, in other arrangements (where e.g. charge-redistribution techniques are used, with the DAC 130 being a capacitive DAC or CDAC), some of the functionality of the elements (e.g. the S/H circuit 110) may be provided as part of the functionality of another element (e.g. the DAC 130).

Continuing with FIG. 1, the comparator 120 compares the held $V_{IN}$ with the output of the internal DAC 130 and outputs the result of the comparison to the SAR 140. The SAR 140 is designed to supply a digital code which approaches (over the successive approximation operations) an approximation of $V_{IN}$ to the internal DAC 130. The DAC 130 supplies the comparator with an analogue voltage based upon the digital code input from the SAR 140.

The SAR 140 is initialised so that its most significant bit (MSB) is equal to digital 1 (the other bits being digital 0). This code is then input to the internal DAC 130, whose output analogue voltage is supplied to the comparator 120. If this analogue voltage is greater than $V_{IN}$ the comparator 120 causes SAR 140 to reset this bit; otherwise, the bit is kept as a 1. Then, the next bit is set to 1 and the same procedure (sub-conversion operation) is followed, continuing this binary search until every bit in the SAR 140 has been tested. The resulting digital code output from the SAR 140 is the digital approximation of the sample voltage $V_{IN}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. Alternatively, such sub-conversions operations may be carries out using self-timed asynchronous circuitry (not shown). This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation.

It will be understood that the SAR ADC circuitry 100 may be configured as differential SAR ADC circuitry 200, as illustrated in FIG. 2. The differential SAR ADC circuitry 200 comprises a track and hold (T&H) block 210, a DAC 220, a voltage comparator 230 and logic circuitry 240, which correspond to the S/H circuit 110, the internal DAC 130, the voltage comparator 120, and the SAR 140 of FIG. 1, respectively.

The T&H block 210 is configured to sample a differential analogue input voltage. The sampled differential analogue input voltage $V_{in}$ comprises two complementary voltage signals (e.g. the sampled analogue input voltage $V_{in-}$ and an inverted version of the sampled analogue input voltage $V_{in-}$). A differential reference voltage $V_{ref}$ is output by the DAC 220. As with the sampled differential voltage $V_{in}$, the differential reference voltage $V_{ref}$ comprises two complementary voltage signals (e.g. the reference voltage $V_{ref+}$ and an inverted version of the reference voltage $V_{ref-}$). The voltage comparator 230 compares the positive (non-inverted) and negative (inverted) elements of a difference signal (i.e. $V_{in}$-$V_{ref}$) generated from $V_{in}$ and $V_{ref}$ as indicated, effectively determining if the difference signal or residue is positive or negative. Several such comparisons are performed, where the number of comparisons defines the ADC resolution. Logic circuitry 240 is configured to output a digital approximation of the sampled differential analogue input voltage $V_{in}$ as a digital output, as described above in relation to the SAR 140.

Thus, in the arrangement of FIG. B, before any comparison is performed, the differential reference voltage $V_{ref}$ is set to 0. For the first comparison, the voltage comparator 230 determines if the residue of the sampled differential voltage $V_{in}$ and the differential reference voltage $V_{ref}$ (i.e. $V_{in}$-$V_{ref}$) is positive or negative. The next comparison adds or subtracts $V_{ref}/2$ to the residue. At each comparison $V_{ref}$ is successively halved (assuming a binary search) and applied to the residue until the residue is zero (i.e. less than the least significant bit (LSB)). If the residue is positive, it is stored in a latch as a 1 and a fraction of $V_{ref}$ is subtracted from the residue, else it is stored in a latch as a 0 and a fraction of $V_{ref}$ is added to the residue.

In conventional SAR ADC circuitry, it is important to detect when the ADC input voltage exceeds a maximum rated voltage (i.e. overvoltage detection). Conventionally, overvoltage detection for ADC circuitry may be performed by using a diode detector-comparator combination or by determining if the final converted digital approximation of a sampled input voltage exceeds or repeatedly hits the digital code corresponding to the maximum rated voltage. Unfortunately, both of these conventional methods of ADC overvoltage detection suffer from problems.

The diode detector-comparator combination relies on a high degree of accuracy and requires additional analogue circuitry to perform overvoltage detection. Overvoltage detection using the converted digital approximation requires additional digital circuitry. Furthermore, both methods have high delays in responding to the overvoltage condition, which increases risk of damage to the ADC circuitry and/or saturation in its digital output.

It is desirable to solve some or all of the above problems.

According to an embodiment of a first aspect of the present invention, there is provided analogue-to-digital converter, ADC, circuitry, comprising: an analogue input terminal, operable to receive an analogue input voltage signal; a comparator having first and second comparator-input terminals and operable to generate a comparison result based on a potential difference applied across those terminals; and successive-approximation control circuitry configured to apply a potential difference across the first and second comparator-input terminals based upon the input voltage signal, and configured to control the potential difference for each of a series of successive approximation operations to cause the comparator to test in each successive approximation operation whether a magnitude of the analogue input voltage signal is bigger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation, the successive approximation operations configured such that the test value for a target one of the successive approximation operations between two other successive approximation operations of the successive approximation operations is, dependent on the comparison result generated by the comparator in each preceding approximation operation, an overvoltage test value whose magnitude is equal to or greater than a magnitude of a full-scale value defining a boundary of a full-scale range of the ADC circuitry, wherein the successive-approximation control circuitry is configured, before carrying out all of the successive approximation operations, to: determine, based on a combination of the comparison results of the target successive approximation operation and at least one preceding approximation operation, if the comparison result of the target successive approximation operation indicates that the magnitude of the analogue input voltage signal is outside said full-scale range.

Thus, by determining if the comparison result of the target successive approximation operation indicates that the magnitude of the analogue input voltage signal is outside said full-scale range, the ADC circuitry is able to detect overvoltage before completion of an overall analogue-to-digital conversion.

The successive-approximation control circuitry may be configured, if it is determined that the magnitude of the analogue input voltage signal is outside said full-scale range, to output an overvoltage signal indicating that the magnitude of the analogue input voltage signal is outside said full-scale range, optionally before carrying out subsequent successive approximation operations.

Advantageously, the comparison result of the target successive approximation operation may indicate that the magnitude of the analogue input voltage signal is outside said full-scale range upon completion of the target successive approximation operation, enabling overvoltage detection to occur without needing to consider the results of subsequent successive approximation operations. This thereby improves the speed with which overvoltage can be detected in ADC circuitry. Furthermore, no additional circuitry (or only minimal additional circuitry, such as a logic gate as described later) is required in order to detect overvoltage, in contrast to conventional ADC overvoltage detection.

The ADC circuitry may comprise overvoltage circuitry configured to: attenuate the analogue input voltage signal, optionally to below a maximum voltage threshold, if it is determined that the magnitude of the analogue input voltage signal is outside said full-scale range, and/or isolate the analogue input voltage signal from the analogue input terminal if it is determined that the magnitude of the analogue input voltage signal is outside said full-scale range.

Advantageously, by attenuating the analogue input voltage signal when the magnitude of the analogue input voltage signal is outside said full-scale range, the ADC circuitry 300 is protected from damage (i.e. by preventing the boundary of a full-scale range of the ADC circuitry 300 being exceeded, or repeatedly exceeded). Attenuating also provides the advantage of ensuring the analogue input voltage signal can be subject to analogue-to-digital conversions without damaging the ADC circuitry 300 and without the ADC output saturating (thus enabling continued "useful" analogue-to-digital conversion).

Advantageously, isolating the analogue input voltage quickly when the magnitude of the analogue input voltage signal is outside said full-scale range ensures the ADC circuitry 300 is protected from damage.

The difference amounts configured for the target successive approximation operation and the at least one preceding approximation operation may be the same as one another.

In embodiments where the difference amounts configured for the target successive approximation operation and the at least one preceding approximation operation are the same as one another, the target successive approximation operation and the at least one preceding approximation operation may be defined as a successive approximation pair.

The successive-approximation control circuitry may be configured, before carrying out all of the successive approximation operations, to: determine based on a combination of the comparison results of the target successive approximation operation and a plurality of preceding approximation operations, if the comparison result of the target successive approximation operation indicates that the magnitude of the analogue input voltage signal is outside said full-scale range.

The series of successive approximation operations may comprise M successive approximation operations performed in a sequential order from a first successive approximation operation to a last successive approximation operation, where M is a positive integer, and the target successive approximation operation may be performed after a second successive approximation operation of the M successive approximation operations and/or before the second to last successive approximation operation of the M successive approximation operations.

The successive-approximation control circuitry may be configured to determine if the comparison result of the target successive approximation operation indicates that the magnitude of the analogue input voltage signal is outside said full-scale range upon completion of the target successive approximation operation.

The successive-approximation control circuitry may comprise a bit register configured to store logic states of N-bits, where N is a positive integer, each bit of the N-bits configured to store the comparison result of a corresponding successive approximation operation, and wherein the successive-approximation control circuitry may be configured to: upon completion of each successive approximation operation, update a logic state of the corresponding bit based on the corresponding comparison result.

The successive-approximation control circuitry may comprise logic circuitry connected to bits of the bit register corresponding to the target successive approximation operation and the at least one preceding approximation operation. The logic circuitry may be configured to generate the overvoltage signal as a high logic output when the updated logic states of the bits corresponding to the target successive approximation operation and the at least one preceding approximation operation have predetermined values, or are the same as one another.

The comparator may be configured to receive a reference voltage signal at the second comparator-input terminal. Each successive approximation operation may be dependent on a comparison result generated by the comparator of a comparison between: the analogue input voltage signal, and the reference voltage signal generated based on the preceding approximation operation.

According to an embodiment of a second aspect of the present invention, there is provided an ADC comprising: a plurality of sub-ADCs, each sub-ADC comprising the ADC circuitry according to the aforementioned first aspect; and ADC overvoltage circuitry configured, if a given sub-ADC determines that the magnitude of its analogue input voltage signal is outside its full-scale range, to control at least one sub-ADC other than the given sub-ADC and/or the given sub-ADC.

The ADC overvoltage circuitry may be configured to: attenuate the analogue input voltage signal of the at least one sub-ADC other than the given sub-ADC and/or the given sub-ADC, if the given sub-ADC determines that the magnitude of its analogue input voltage signal is outside its full-scale range; and/or isolate the analogue input voltage signal of the at least one sub-ADC other than the given sub-ADC from its analogue input terminal and/or the given sub-ADC from its analogue input terminal, if the given sub-ADC determines that the magnitude of its analogue input voltage signal is outside its full-scale range.

According to an embodiment of a fourth aspect of the present invention, there is provided integrated circuitry such as an IC chip comprising the ADC circuitry as claimed in the aforementioned first or second aspects.

According to an embodiment of a fifth aspect of the present invention, there is provided a method of controlling analogue-to-digital converter, ADC, circuitry, the ADC circuitry comprising an analogue input terminal, operable to receive an analogue input voltage signal; a comparator having first and second comparator-input terminals and operable to generate a comparison result based on a potential difference applied across those terminals; and successive-approximation control circuitry configured to apply a potential difference across the first and second comparator-input terminals based upon the input voltage signal, and configured to control the potential difference for each of a series of successive approximation operations to cause the comparator to test in each successive approximation operation whether a magnitude of the analogue input voltage signal is bigger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation, wherein the test value for a target one of the successive approximation operations between two other successive approximation operations of the successive approximation operations is, dependent on the comparison result generated by the comparator in each preceding approximation operation, an overvoltage test value whose magnitude is equal to or greater than a magnitude of a full-scale value defining a boundary of a full-scale range of the ADC, the method comprising: before carrying out all of the successive approximation operations, determining, based on a combination of the comparison results of the target successive approximation operation and at least one preceding approximation operation, if the comparison result of the target successive approximation operation indicates that the magnitude of the analogue input voltage signal is outside said full-scale range.

According to an embodiment of a sixth aspect of the present invention, there is provided analogue-to-digital converter circuitry, comprising: an analogue input terminal, operable to receive an analogue input voltage signal; a comparator having first and second comparator-input terminals and operable to generate a comparison result based on a potential difference applied across those terminals; and successive-approximation control circuitry configured to apply a potential difference across the first and second comparator-input terminals based upon the input voltage signal, and configured to control the potential difference for each of a series of successive approximation operations to cause the comparator to test in each approximation operation whether a magnitude of the analogue input voltage signal is bigger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation, wherein the successive-approximation control circuitry is configured, before carrying out all of the approximation operations, to: determine based on a combination of at least two of the comparison results of the approximation operations that have been carried out, if a defined condition has been met; and if it is determined that the defined condition has been met, output a signal indicating that the defined condition has been met.

Reference will now be made, by way of example, to the accompanying drawings, of which:

FIG. 1, mentioned above, is a schematic diagram of a conventional SAR ADC;

FIG. 2, mentioned above, is a schematic diagram of another conventional SAR ADC;

In the binary search process described above, it is desirable to avoid conversion errors. This is because the analogue input signal $V_{IN}$ has a specific corresponding digital code, and once a conversion error is made the SAR ADC circuitry 100, 200 is unable to produce the correct digital code for that analogue input signal $V_{IN}$. For example, with reference to the SAR ADC circuitry 200 of FIG. 2, if an error occurs during a sub-conversion (e.g. due to the comparator making a decision "too early", or making the "wrong" decision due to noise on its inputs or supply), a fraction of $V_{ref}$ may be added to the residue, rather than being subtracted, thereby resulting in the binary search diverging (from the correct path). Once the binary search diverges, it is no longer possible to arrive at a residue of zero (i.e. less than the LSB) resulting in an incorrect analogue-to-digital conversion.

Figure 3:
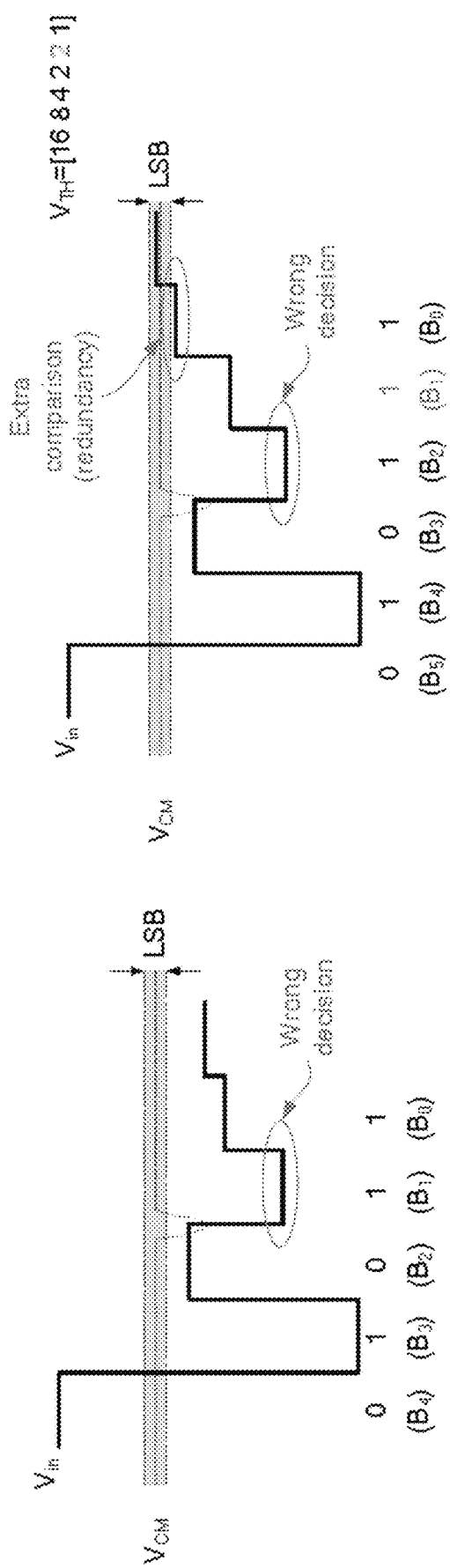
FIGS. 3A and 3B are graphical representations of an N-bit analogue-to-digital conversion using the SAR ADC of FIG. 2.

In order to generate a level of ADC error tolerance for SAR ADC circuitry 100, 200, additional sub-conversion(s) is/are introduced to the binary search to provide a means for resolving ADC conversions in the event of an error occurring during one of the sub-conversions. That is, by introducing an additional sub-conversion it becomes possible to resolve an erroneous analogue-to-digital conversion, because the additional sub-conversion enables the modified search to arrive at a residue of zero (or less than the LSB). The additional sub-conversion may be considered a redundant sub-conversion which is provided, for example, with a corresponding redundancy bit in a bit register stored in the SAR 140 (or the logic circuitry 240). In order to assist in the understanding of ADC error tolerance, an analogue-to-digital conversion with no additional sub-conversion will now be compared to an analogue-to-digital conversion with one additional sub-conversion, with reference to FIGS. 3A and 3B.

Figure 2:
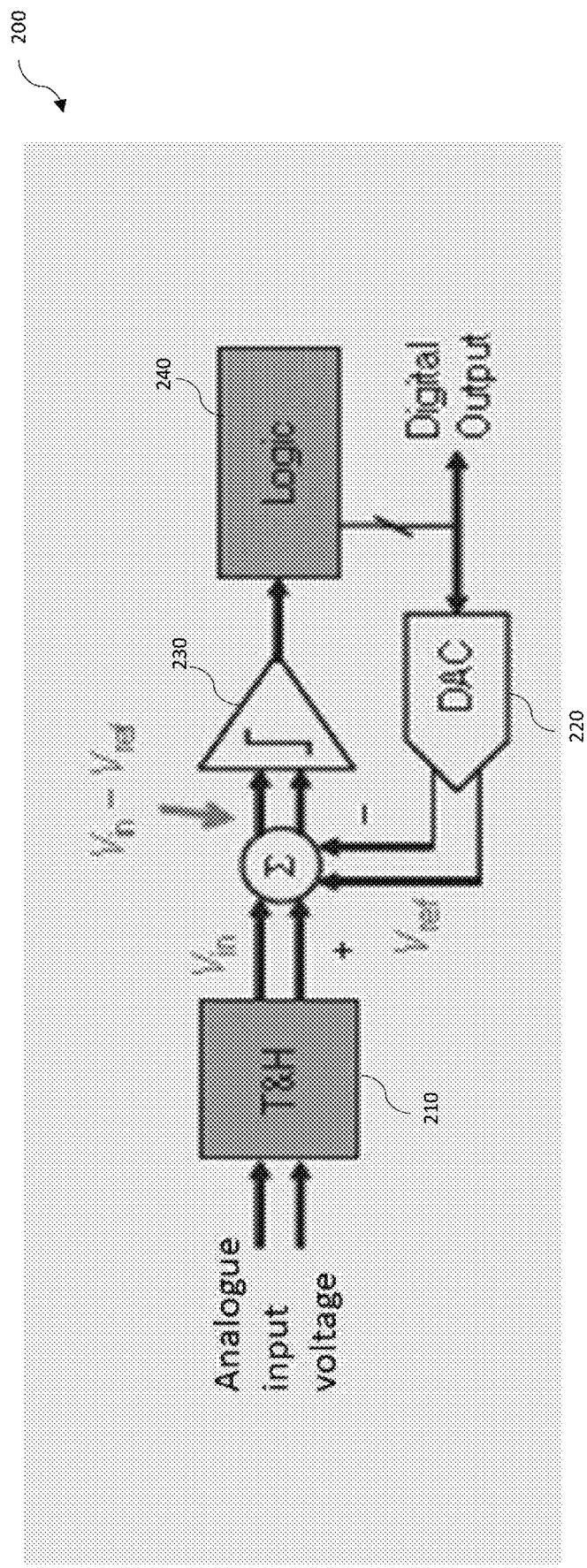

FIG. 3A illustrates an N-bit analogue-to-digital conversion using the SAR ADC 200 of FIG. 2. In the embodiment illustrated by FIG. 3A, the SAR ADC 200 carries out five sub-conversion operations corresponding to five bits: $B_0$, $B_1$, $B_2$, $B_3$ and $B_4$, with $B_0$ being the LSB and $B_4$ being the MSB. As illustrated in FIG. 3A, an error occurs during the sub-conversion corresponding to bit $B_1$ (indicated by the dip in common mode voltage $V_{CM}$ and the wording "wrong decision"), which causes a fraction of $V_{ref}$ to be subtracted from the residue, rather than being added. As a result, the SAR ADC 200 is unable to resolve the analogue-to-digital conversion to less than the LSB.

FIG. 3B, on the other hand, illustrates an embodiment of the SAR ADC 200 in which one additional sub-conversion has been introduced (with a corresponding redundancy bit) to perform an N+1 bit analogue-to-digital conversion. The SAR ADC 200 of FIG. 3B therefore comprises five ADC bits and one redundancy bit, as follows:

ADC bits: $B_0$, $B_2$, $B_3$, $B_4$ and $B_5$, with $B_0$ being the LSB and $B_5$ being the MSB;
Redundancy bit: $B_1$ (as illustrated by the wording "extra comparison (redundancy)").

The weighting of each bit of the SAR ADC 200 in FIG. 3B (illustrated by $V_{TH}$ in FIG. 3B) is as follows:

$B_0=1$, $B_1=2$, $B_2=2$, $B_3=4$, $B_4=8$ and $B_5=16$.

Redundancy bit $B_1$ has the same weighting as ADC bit $B_2$, and therefore $B_1$ and $B_2$ may be referred to as a redundancy bit pair.

In the N+1 analogue-to-digital conversion illustrated in FIG. 3B, an error occurs during the sub-conversion corresponding to bit $B_2$ (indicated by the dip in common mode voltage $V_{CM}$ and the wording "wrong decision"), which causes a fraction of $V_{ref}$ to be subtracted from the residue of $V_n$-$V_{ref}$, rather than being added. However, in contrast to the N-bit analogue-to-digital conversion of FIG. 3A, the introduction of redundancy bit $B_1$ results in the SAR ADC 200 resolving the analogue-to-digital conversion to within the LSB, thereby correcting the error.

Upon completion of the N+1 bit analogue-to-digital conversions, the resulting N+1 bit digital code may be converted to a digital code corresponding to an N bit analogue-to-digital conversion. This conversion from the N+1 bit digital code to the N bit digital code may be performed using conventional methods (e.g. using databases and/or look-up tables).

It will be understood that the N+1 bit analogue-to-digital conversion may comprise any number of ADC bits and any number of redundancy bits. It will also be understood that the bits of the redundancy bit pair may be positional adjacently in the bit register, as in the SAR ADC 200 of FIG. 3B, or ADC bits may be positioned between the bits of the redundancy bit pair. For example, the SAR ADC 200 may comprise eleven ADC bits with binary weightings of 1, 2, 4, 8, 16, 32, 64, 128, 256, 512 and 1024, and two redundancy bits having weightings of 128 and 8, respectively (i.e. two redundancy bit pairs at weightings of 128 and 8). In such a case, assuming the bits of the redundancy bit pairs are adjacent, the weightings would be 1, 2, 4, 8, 8, 16, 32, 64, 128, 128, 256, 512 and 1024.

Incidentally, although binary weighting systems are considered herein for convenience (e.g. 1, 2, 4, 8 etc.), it will be appreciated that non-binary weightings may also be employed (e.g. 1, 1.5, 2.5, 4.5, 8, etc.) and the present disclosure will be understood accordingly.

According to embodiments of the present invention, additional sub-conversions may be further utilised in such a way to provide a means for ADC overvoltage detection. In particular, according to embodiments of the present invention, during successive approximation operations of an N+R bit ADC (where R is the number of redundancy bits), digital approximation of the N+R bits may be used to determine an early warning of overvoltage. Furthermore, a pattern of bits comprising the redundancy bit may be used to quickly detect overvoltage in the ADC.

Figure 4:
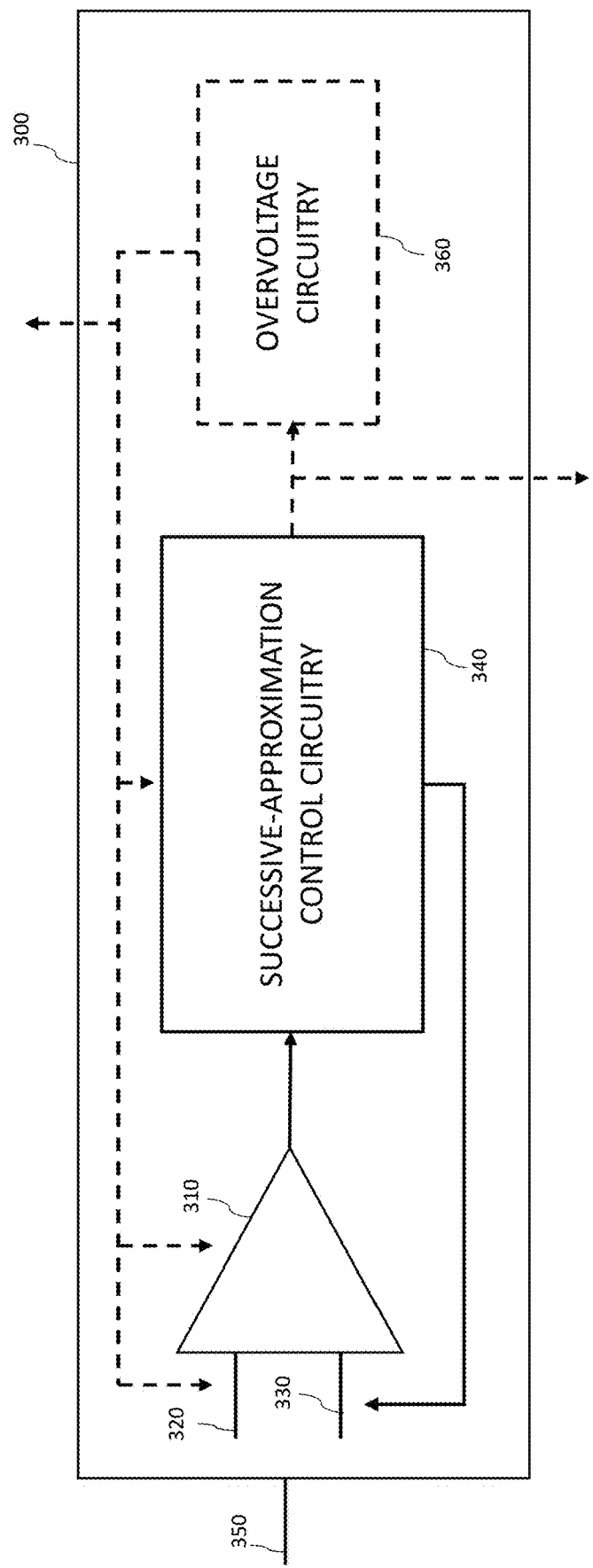
FIG. 4 is a schematic diagram of ADC circuitry embodying the present invention.

FIG. 4 illustrates ADC circuitry 300 comprising an analogue input terminal 350, a comparator 310 and successive-approximation control circuitry 340. The analogue input terminal 350 is operable to receive an analogue input voltage signal from external circuitry (not shown). The analogue input voltage signal may be any static or time varying voltage signal generated by external circuitry. The external circuitry may be a preceding stage of the ADC circuitry 300 or may be other circuitry, for example a voltage buffer.

The comparator 310 comprises first and second comparator-input terminals 320, 330. The first comparator-input terminal 320 may be connected directly to the analogue input terminal 350 such that the analogue input voltage signal is applied to the first comparator-input terminal as a first comparator input signal. Alternatively, for example in the case of a charge-redistribution topology, the first comparator-input terminal 320 may be connected to the analogue input terminal 350 via the successive-approximation control circuitry 340 such that the successive-approximation control circuitry 340 controls how the analogue input voltage signal is applied to the first comparator-input terminal 320.

Figure 1:
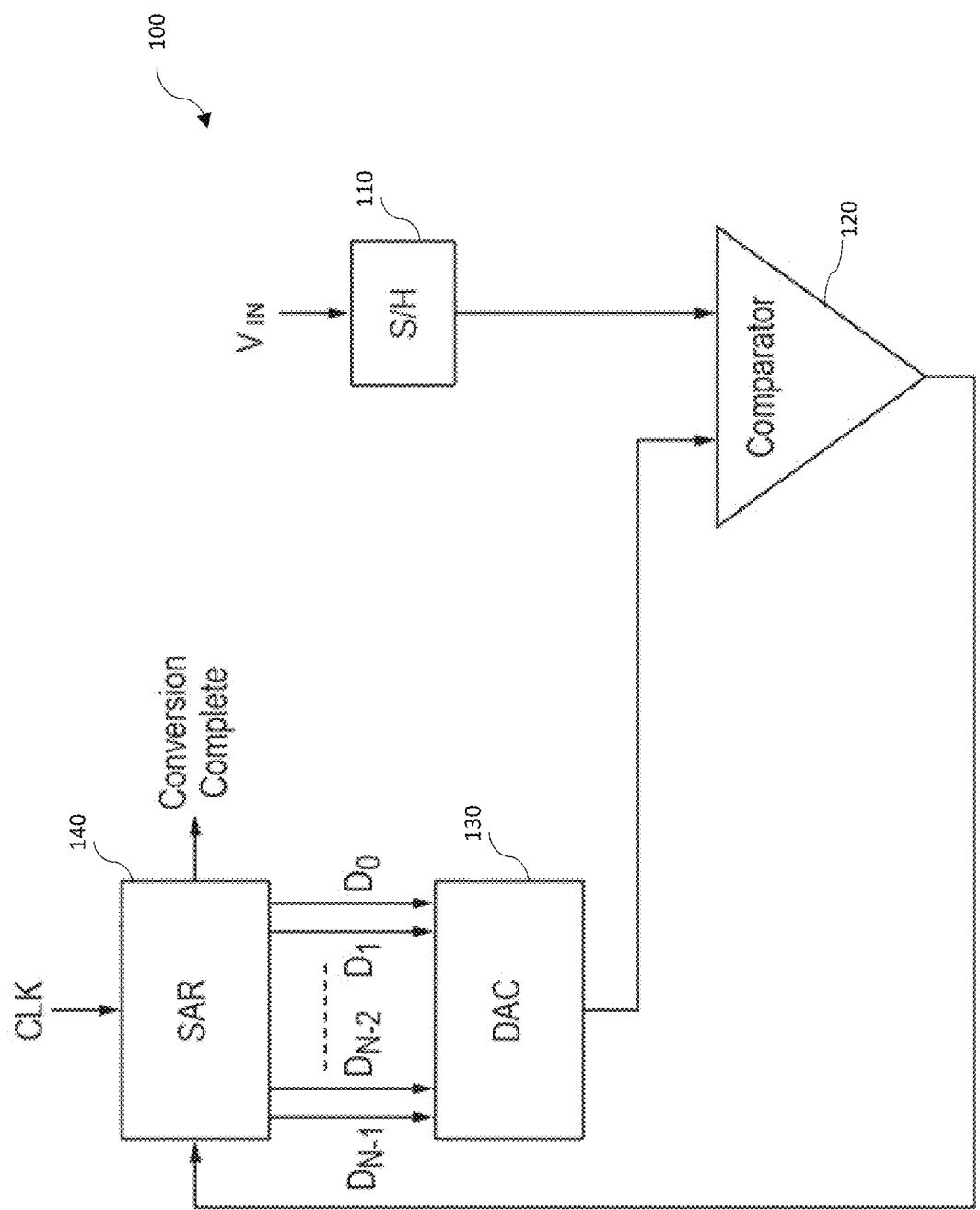

As discussed above in relation to FIGS. 1 to 3, the analogue input voltage signal may be a differential voltage signal or the analogue input voltage signal may be a single-ended voltage signal (i.e. not a differential voltage signal).

Depending on whether the analogue input voltage signal is a single-ended or differential signal, one or both of the comparator-input terminals 320, 330 may be connected to charge redistribution circuitry (not shown) of the successive-approximation control circuitry 340. The charge redistribution circuitry may be configured to control the voltage applied at one or both of the comparator-input terminals 320, 330 dependent on the weightings of capacitors of the charge redistribution circuitry and the output of the comparator in each successive approximation operation.

The comparator 310 is operable to generate a comparison result based on a potential difference applied across the first and second comparator-input terminals 310, 320. For example, if the first comparator input signal (at terminal 320) is greater than a second comparator input signal (at terminal 330), the potential difference may be positive and the comparator may generate a high logic state as the comparison result. Whereas, if the first comparator signal is less than the second comparator signal, the potential difference may be negative and the comparator 310 may generate a low logic state as the comparison result.

As discussed above, the potential difference across the first and second comparator-input terminals 320, 330 is controlled by the successive-approximation control circuitry 340 (e.g. by applying the analogue input voltage signal and the reference signal, either directly or indirectly, to the first and second comparator-input terminals 320, 330 as first and second comparator signals, respectively). Control of the potential difference by the successive-approximation control circuitry 340 is indicated by an arrow feeding back to the comparator input terminals 320, 330 in FIG. 4 and is performed for each of a series of successive approximation operations.

Each successive approximation operation is performed in a similar manner as the sub-conversions of the SAR ADC circuitry 100, discussed above in relation to FIG. 1.

Therefore, only a brief description of the successive approximation operations of ADC circuitry 300 is provided below, to avoid repetition.

In each successive approximation operation, the comparator tests whether a magnitude of the analogue input voltage signal is bigger or smaller than a corresponding test value. The corresponding test value for each successive approximation operation is dependent on a comparison result generated by the comparator 310 in a preceding (successive) approximation operation. Each given test value is configured to be bigger or smaller than the preceding test value from the preceding approximation operation by a difference amount. The residue described above may be defined as: the analogue input voltage signal minus the test value.

The difference amount is configured for each successive approximation operation according to which stage of the binary search that particular successive approximation operation corresponds. For example, the different amount for each given successive approximation operation may be calculated as a fraction of the first test value from the first successive approximation operation.

In a single-ended implementation, each test value may be applied directly to one of the comparator input terminals 320, 330, with for example the analogue input voltage signal applied to the other comparator input terminal. In a differential implementation, for example using a charge redistribution topology, each test value may be tested by varying the voltage between the comparator input terminals 320, 330 by an amount based on the test value.

In certain embodiments, if the comparator 310 determines that the magnitude of the analogue input voltage signal is bigger than the magnitude of the corresponding test value, the comparator 310 may generate a high logic state as the comparison result. On the other hand, if the comparator 310 determines that the magnitude of the analogue input voltage signal is smaller than the magnitude of the corresponding test value, the comparator 310 may generate a low logic state as the comparison result.

The successive approximation control circuitry 340 (including charge redistribution circuitry where provided) is configured such that the test value of a target one of the successive approximation operations is, dependent on the comparison result in one or more of the preceding successive approximation operations, an overvoltage test value.

The overvoltage test value is a test value whose magnitude is equal to or greater than a magnitude of a full-scale value defining a boundary of a full-scale range of the ADC circuitry 300. For example, in an embodiment where the ADC circuitry 300 is a five-bit ADC, the boundary of the digital full scale range of the ADC circuitry 300 may be a binary value of 11111 (corresponding to the upper value of a decimal range 0 to 31), and therefore the full-scale value would be an analogue input voltage level intended to correspond to the digital output 11111 (corresponding to decimal 31).

The target one of the successive approximation operations may correspond to an additional sub-conversion, as described above, or may correspond to a sub-conversion configured to have the overvoltage test value by virtue of an earlier additional sub-conversion in the sequence of additional sub-conversions. For example, by adding an additional sub-conversion it may be ensured that the test value of one of the subsequent sub-conversions (e.g. the immediately-subsequent or next sub-conversion) is, dependent on the comparison result in one or more of the preceding sub-conversions, the overvoltage test value.

Furthermore, the target one of the successive approximation operations may be performed at any point in the series of successive approximation operations between two other successive approximation operations. For example, the series of successive approximation operations may comprise M successive approximation operations performed in a sequential order from a first successive approximation operation to a last successive approximation operation, where M is a positive integer. In such embodiments, the target successive approximation operation may be performed after a first or second successive approximation operation of the M successive approximation operations and/or before the second to last or last successive approximation operation of the M successive approximation operations. Furthermore, the target successive approximation operation may be performed in any of: the first half, the first third or the first quarter of the M successive approximation operations.

Advantageously, by positioning the target successive approximation operation as described above, the ADC circuitry 300 is able to detect overvoltage before completion of an overall analogue-to-digital conversion. That is, the comparison result of the target successive approximation operation may indicate that the magnitude of the analogue input voltage signal is outside said full-scale range upon completion of the target successive approximation operation, enabling overvoltage detection to occur without needing to consider the results of subsequent successive approximation operations. This thereby improves the speed with which overvoltage can be detected in ADC circuitry. Furthermore, no additional circuitry (or only minimal additional circuitry, such as a logic gate as described later) is required in order to detect overvoltage, in contrast to conventional ADC overvoltage detection.

In certain embodiments, the difference amounts configured for the target successive approximation operation and at least one preceding approximation operation may be the same as one another (i.e. to form a successive approximation pair, corresponding to a redundancy bit pair, as discussed below in relation to FIG. 5).

In order to perform overvoltage detection, the successive approximation control circuitry 340 analyses the comparison results of the target successive approximation operation and at least one preceding (successive) approximation operation in order to determine if the comparison result of the target successive approximation operation indicates that the magnitude of the analogue input voltage signal is outside said full-scale range (i.e. overvoltage has occurred at the analogue input terminal 350). For example, the successive approximation control circuitry 340 may determine that overvoltage has occurred if the comparison result of the target successive approximation and the comparison results of at least one preceding (successive) approximation operations are both either a high logic state or a low logic state, as illustrated in FIG. 5.

Figure 5:
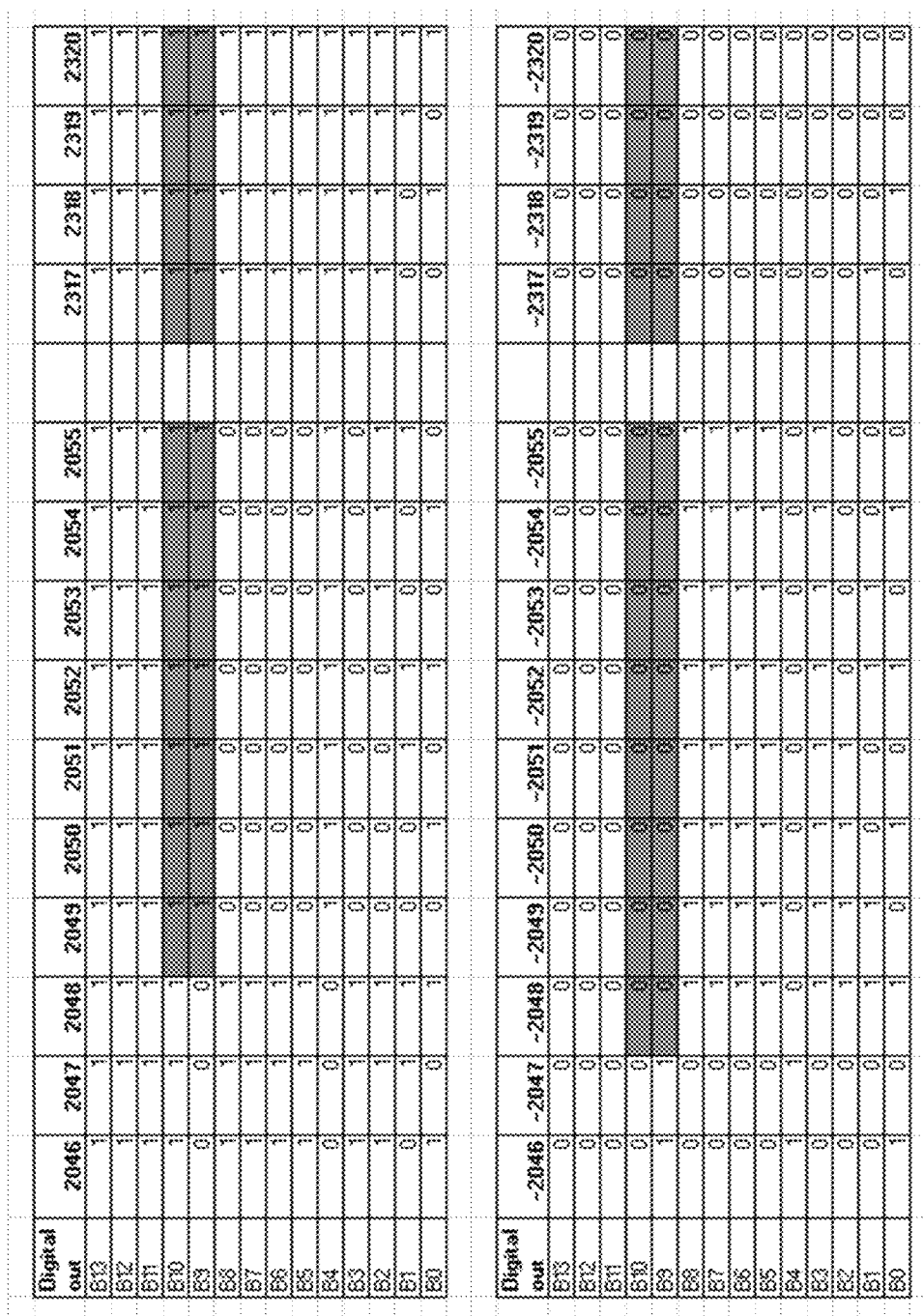
FIG. 5 is a table representation of analogue-to-digital conversions performed by the ADC of FIG. 4.

FIG. 5 illustrates two tables each representing an embodiment in which the ADC circuitry 300 is a twelve-bit ADC with two redundancy bits, where the boundary of the full scale digital range of the twelve-bit ADC is +/−2048. B13 is the MSB and B0 is the LSB out of the 14 bits output from the series of successive approximations. The (non-redundancy) ADC bits are B13 to B10, B8 to B4, and B2 to B0, and the redundancy bits are B9 and B3 in this example. The resulting digital approximations of sample voltages (i.e. analogue input voltages) corresponding to each column of fourteen bits are illustrated as "Digital out", ranging from +/−2046 to +/−2320 (i.e., the top table illustrates digital approximations ranging from 2046 to 2320 and the bottom table illustrates digital approximations ranging from −2046 to −2320, and include values corresponding to both positive and negative overvoltages). The target one of the successive approximation operations in this example corresponds to the fifth bit (i.e. B9). In this embodiment, B9 and B10 are highlighted as a successive approximation pair because they both have the same binary weighting, and the comparison result of B10 and B9 indicate whether or not overvoltage has occurred.

As illustrated in the top table of FIG. 5, the comparison results for both $B_{10}$ and $B_9$ are a high logic state (illustrated by a "1") when the digital approximation exceeds the boundary of +2048 (i.e. 2049 to 2320). Therefore, by identifying that both $B_{10}$ and $B_9$ correspond to a high logic state, the ADC circuitry 300 is able to determine that an overvoltage has occurred. Advantageously, this overvoltage detection can be performed before the ADC circuitry has completed the analogue-to-digital conversion, i.e., by focusing on (only) the $B_9$ and $B_{10}$ results, which thereby improves the speed and efficiency with which overvoltage is detected.

The bottom table of FIG. 5 illustrates that the comparison results for both B10 and B9 are a low logic state (illustrated by "0") when the digital approximation meets or exceeds the boundary of −2048 (i.e. −2048 to −2320), and therefore overvoltage can be determined in a similar way as with the top table by identifying that both B10 and B9 correspond to a low logic state.

Due to the digital approximation being asymmetric around zero, the comparison results for B10 and B9 are the same logic state for the digital approximation −2048 in the bottom table, whereas the comparison results for B10 and B9 are not the same logic state for the digital approximation +2048 in the top table. For example, in embodiments where the ADC circuitry 300 is a three-bit ADC, the digital approximations are asymmetric around zero, as follows: −3, −2, −1, 0, 1, 2, 3 and 4.

Advantageously, in the embodiment of FIG. 5, overvoltage is detected after the fourth successive approximation operation has been performed based on the comparison results corresponding to B9 and B10. In other words, the ADC circuitry 300 is not required to wait until all the successive approximation operations have been completed before determining if overvoltage has occurred; instead overvoltage may be detected immediately after the fourth successive approximation has been completed.

According to certain embodiments, the successive approximation control circuitry 340 may analyse the comparison results of the target successive approximation operation and a plurality of preceding (successive) approximation operations in order to determine if the comparison result of the target successive approximation operation indicates that the magnitude of the analogue input voltage signal is outside said full-scale range (i.e. overvoltage has occurred). Therefore, in the embodiment of FIG. 5, overvoltage may be detected based on a combination of the comparison results for all of B13 to B9. That is, if the comparison results of B13 to B9 are all either a high logic state or a low logic state, the ADC circuitry 300 may determine that overvoltage has occurred. Of course, in the example of FIG. 5 it may be simpler to base the overvoltage detection on just the comparison results of B10 and B9.

Once the ADC circuitry 300 (successive approximation control circuitry 340) has determined that overvoltage has occurred (i.e. that the magnitude of the analogue input voltage signal is outside said full-scale range), an overvoltage signal may be output as indicated in FIG. 4. The overvoltage signal may indicate that the magnitude of the analogue input voltage signal is outside said full-scale range. In the embodiment discussed above in relation to FIG. 5, the overvoltage signal may be output when the comparison results of B10 and B9 are both a low logic state or are both a high logic state.

In certain embodiments, the overvoltage signal may be output before carrying out subsequent successive approximation operations. That is, the ADC circuitry 300 (in particular, the successive approximation control circuitry 340) may output the overvoltage signal immediately after determining that the magnitude of the analogue input voltage signal is outside said full-scale range (i.e. the ADC circuitry does not wait until the analogue-to-digital conversion has been completed before outputting the overvoltage signal). As indicated in FIG. 4, the overvoltage signal may be output for use by the ADC circuitry 300 itself and/or for use by other circuitry, for example another instance of ADC circuitry 300 as described later.

The ADC circuitry 300 may optionally comprise overvoltage circuitry 360 configured to perform an overvoltage operation in response to receiving the overvoltage signal from the successive approximation control circuitry 340. A first example of the overvoltage operation is attenuating the analogue input voltage signal to below a maximum voltage threshold, indicated in FIG. 4 by a dashed arrow feeding back from the overvoltage circuitry 360 to the comparator input terminals 320, 330 and the successive approximation control circuitry 340. The analogue input voltage may be attenuated, for example, by using passive components (such as resistors) in order to reduce the power of the analogue input voltage signal without significantly distorting the analogue input voltage waveform. Advantageously, by attenuating the analogue input voltage signal when the magnitude of the analogue input voltage signal is outside said full-scale range, the ADC circuitry 300 is protected from damage (i.e. by preventing the boundary of a full-scale range of the ADC circuitry 300 being exceeded). Attenuating also provides the advantage of ensuring the analogue input voltage signal can be subject to analogue-to-digital conversions without damaging the ADC circuitry 300 and without the ADC output saturating (thus enabling continued "useful" analogue-to-digital conversion).

The maximum voltage threshold may be a voltage which if matched or exceeded and applied to the ADC circuitry 300 would cause damage to certain components of the ADC circuitry 300. The maximum voltage threshold may be a predetermined voltage defined according to physical characteristics (configurations of components) of the ADC circuitry 300.

A second example of the overvoltage operation is isolating the analogue input voltage signal from the analogue input terminal, indicated in FIG. 4 by a dashed arrow feeding back from the overvoltage circuitry 360 to the comparator 310 e.g., to set its input terminals to a high-input-impedance or disconnected state. Isolation may be performed, for example, by connecting the analogue input voltage signal to a low voltage (i.e. ground) terminal. Alternatively, isolation may be performed by disconnecting the first comparator-input terminal 320 from the analogue input terminal 350. Advantageously, isolating the analogue input voltage when the magnitude of the analogue input voltage signal is outside said full-scale range ensures the ADC circuitry 300 is protected from damage.

As mentioned above and described later, the overvoltage operation or operations may be applied to other circuitry, for example another instance of ADC circuitry 300, indicated in FIG. 4 by a dashed arrow passing from the overvoltage circuitry 360 out of the ADC circuitry 300.

Figure 6:
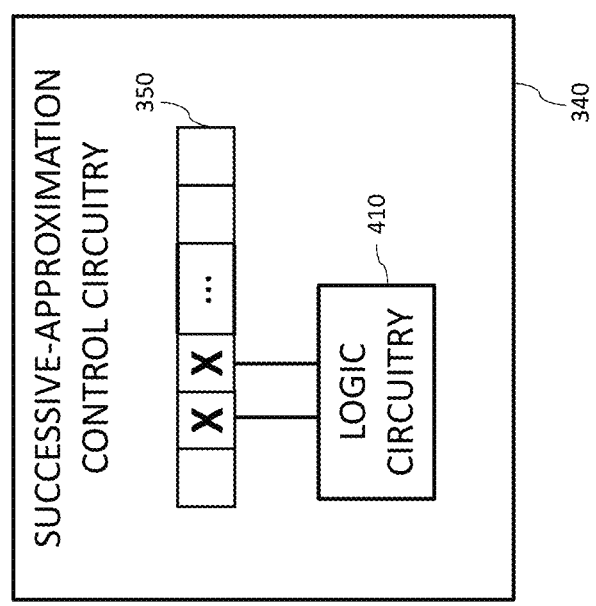
FIG. 6 is a schematic diagram of successive-approximation control circuitry forming part of the ADC circuitry of FIG. 4.

According to certain embodiments, the successive-approximation control circuitry 340 may comprise a bit register 350 configured to store logic states of N-bits, where N is a positive integer, as illustrated in FIG. 6. Each bit of the N-bits may be configured to store the comparison result of a corresponding successive approximation operation. For example, in an embodiments where the ADC circuitry 300 performs five successive approximation operations, the bit register 350 comprises five bits, one for each successive approximation operation.

In embodiments where the successive-approximation control circuitry 340 comprises the bit register 350, logic states of the bits may be updated upon completion of each corresponding successive approximation operation based on the corresponding comparison result (i.e. updated as a high logic state or a low logic state).

The successive-approximation control circuitry 340 may additionally comprise logic circuitry 410, as illustrated in FIG. 6. The logic circuitry 410 is connected to bits of the bit register 350 corresponding to the target successive approximation operation and the at least one preceding approximation operation. That is, elements of the bit register 350 (represented with an "X" in FIG. 6) which comprise the bits corresponding to the target successive approximation operation and the at least one preceding approximation operation are connected to the logic circuitry 410. The logic circuitry may be configured to generate the overvoltage signal as a high logic output when the updated logic states of the bits corresponding to the target successive approximation operation and the at least one preceding approximation operation have predetermined values, or are the same as one another. For example, the updated logic states of the bits may both be high (i.e. "1"), both be low (i.e. 0) or may be a predetermined sequence of logic states (e.g. "01" or "10") depending on the application. In embodiments where a plurality of preceding (successive) approximation operations are used in the determining of an overvoltage, the predetermined values may be a longer sequence of logic states (e.g. "11111", "00000", "00001", "11110" etc.), again depending on the application. In certain embodiments, the logic circuitry 410 may be located independently of the successive-approximation control circuitry 340 (outside of the successive-approximation control circuitry 340) as part of the ADC circuitry 300.

Figure 7:
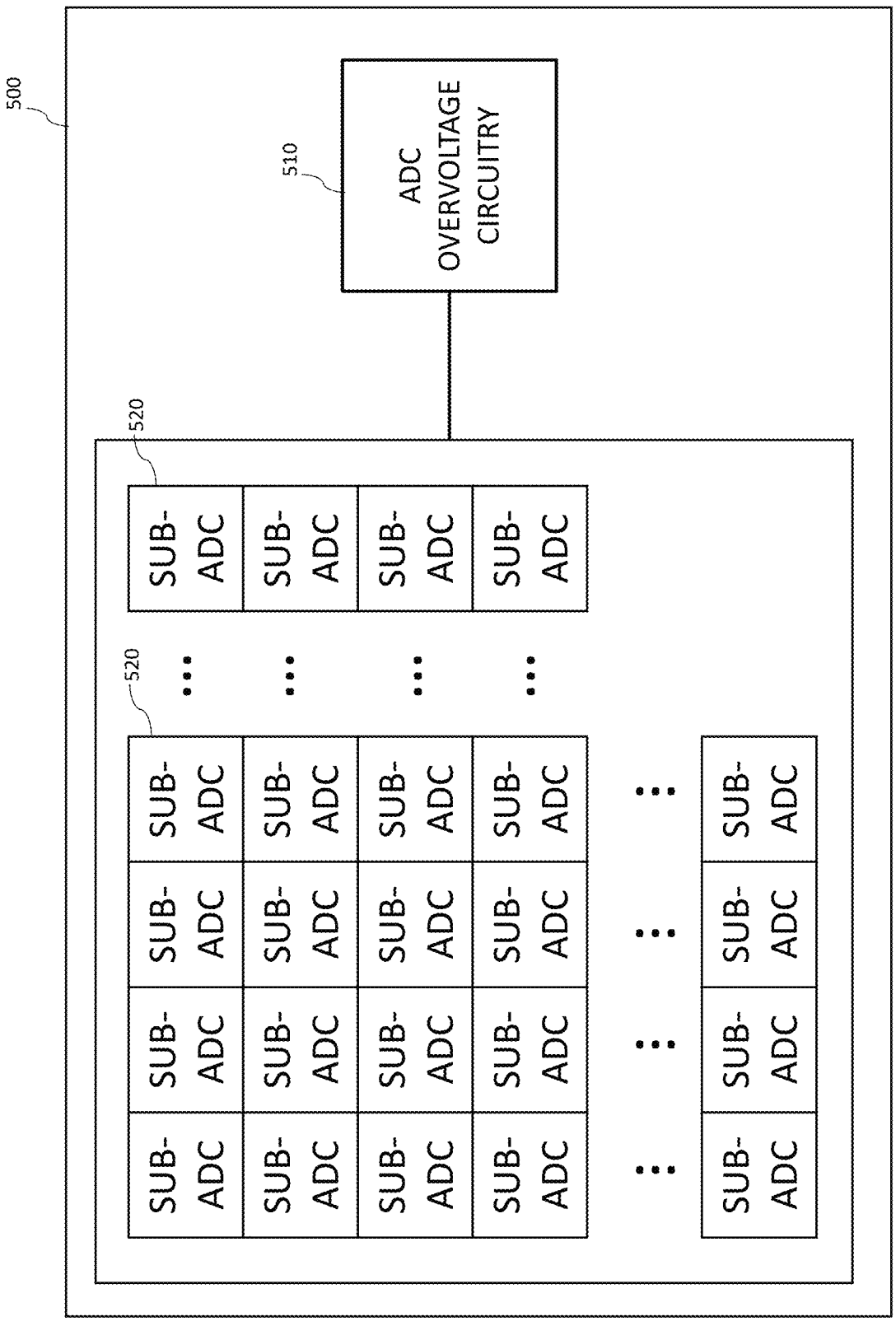
FIG. 7 is a schematic diagram of an ADC comprising a plurality of sub-ADCs embodying the present invention.

The ADC circuitry 300 described above may be implemented as a sub-ADC as part of a larger ADC 500. In particular, FIG. 7 illustrates an embodiment in which ADC 500 comprises a plurality of sub-ADCs 520, each sub-ADC 520 comprising the ADC circuitry 300 as described above. That is, each sub-ADC may comprise some or all of the features of the ADC circuitry 300 described above in relation to FIGS. 4 to 6. The sub-ADCs 520 may be configured to operate in a time-interleaved manner to collectively perform analogue-to-digital conversion of a shared analogue input voltage signal.

The ADC 500 may further comprise ADC overvoltage circuitry 510 (which may replace or cooperate with the overvoltage circuitry 360 in each sub-ADC 520). The ADC overvoltage circuitry 510 may be configured to control a given sub-ADC and/or at least one sub-ADC other than the given sub-ADC, if the given sub-ADC determines that the magnitude of its analogue input voltage signal is outside its full-scale range. In other words, if any one of the sub-ADCs detects an overvoltage, that sub-ADC may control itself and/or another one or more of the sub-ADCs (immediately) in response to detecting the overvoltage. In certain embodiments, every sub-ADC 520 of the ADC 500 may be controlled in response to a given sub-ADC 520 detecting an overvoltage. Furthermore, the ADC 500 may be configured to determine that overvoltage of the ADC 500 only occurs when a predetermined number (e.g. 5, 10, 100) of sub-ADCs detect an overvoltage (i.e. detect that the magnitude of a respective analogue input voltage signal sample is outside said full-scale range of the respective sub-ADC). The predetermined number of sub-ADCs 520 required to detect an overvoltage before an ADC 500 overvoltage is determined may be programmable.

The ADC overvoltage circuitry 510 may be configured to control at least one sub-ADC other than a given sub-ADC and/or the given sub-ADC by attenuating the respective analogue input voltage signal or isolating the respective analogue input voltage signal. The attenuating or isolating may be performed in the same manner as described above in relation to FIGS. 4 and 6.

Figure 8:
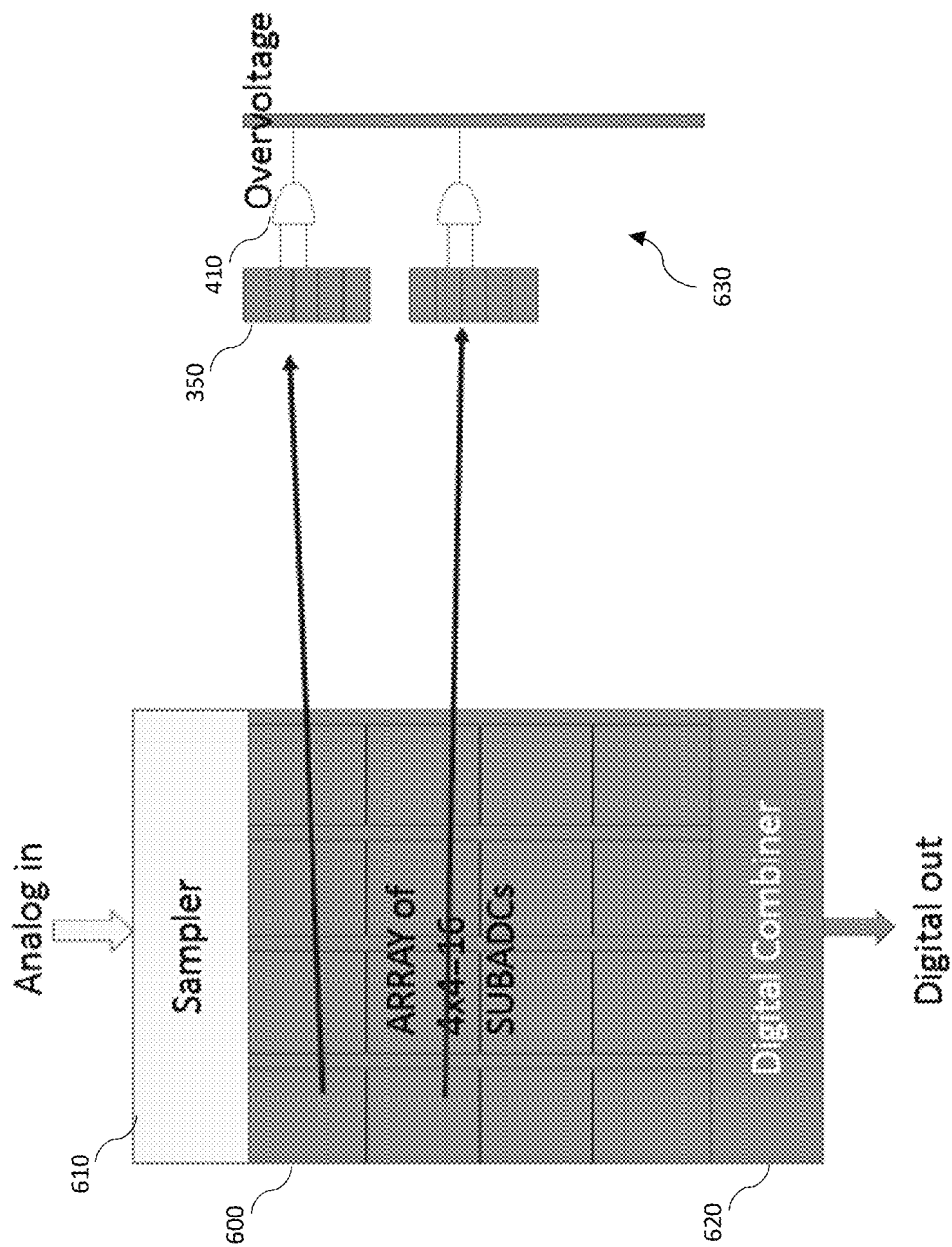
FIG. 8 is a schematic diagram of another ADC comprising a plurality of sub-ADCs and embodying the present invention.

FIG. 8 illustrates an alternative embodiment in which an ADC 600 comprises a plurality of sub-ADCs (i.e. ARRAY of 4×4_16SUBADCs). The ADC of FIG. 8 further comprises a sampler 610 (configured to generate analogue samples from the analogue input signal for analogue-to-digital conversion by respective sub-ADCs), and a digital combiner 620 configured to combine the digital outputs from the respective sub-ADCs into a combined digital output. Circuitry 630 corresponding to the bit register 350 and logic circuitry 410 of the successive approximation control circuitry 340 of each sub-ADC is shown to one side for ease of understanding (and only explicitly shown for two sub-ADCs for simplicity). As indicated, the logic circuitry 410 could have an AND function where an example two bits are configured to have 11 values to indicate overvoltage. As also indicated, the outputs of the logic circuits 410 could be connected together (providing an OR function) so that if any one of them indicates an overvoltage this is detected for the whole ADC 600. The ADC 600 operates in the same manner as the ADC 500, and therefore a description of the ADC 600 operation has been omitted for brevity.

Figure 9:
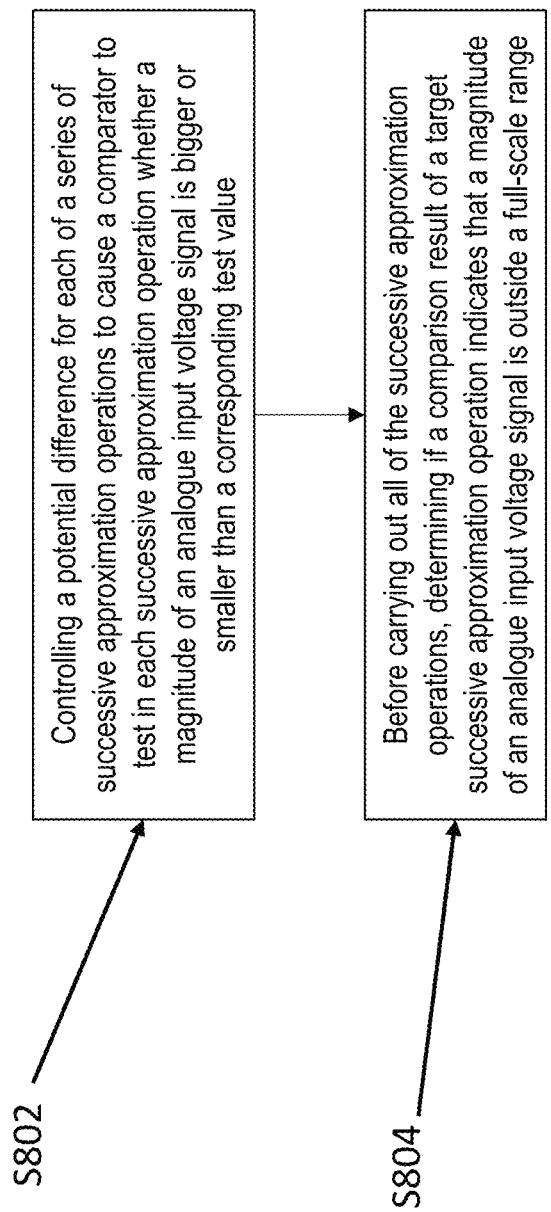
FIG. 9 is flowchart illustrating method steps performed by the ADC circuitry of FIG. 4.

FIG. 9 is a flowchart illustrating a method of overvoltage detection performed by the ADC circuitry 300, 500, 600. In step S802, the successive-approximation control circuitry 340 controls the potential difference applied across the first and second comparator-input terminals 320, 330 for each of a series of successive approximation operations, as described above in relation to FIGS. 4 to 8. In step S804, the successive-approximation control circuitry 340 determines if the comparison result of a target successive approximation operation indicates that a magnitude of the analogue input voltage signal is outside a full-scale range, as described above in relation to FIGS. 4 to 8. In particular, the method controls the successive-approximation control circuitry 340 to perform the step of S804 before carrying out all of the successive approximation operations, as described above.

Figure 10:
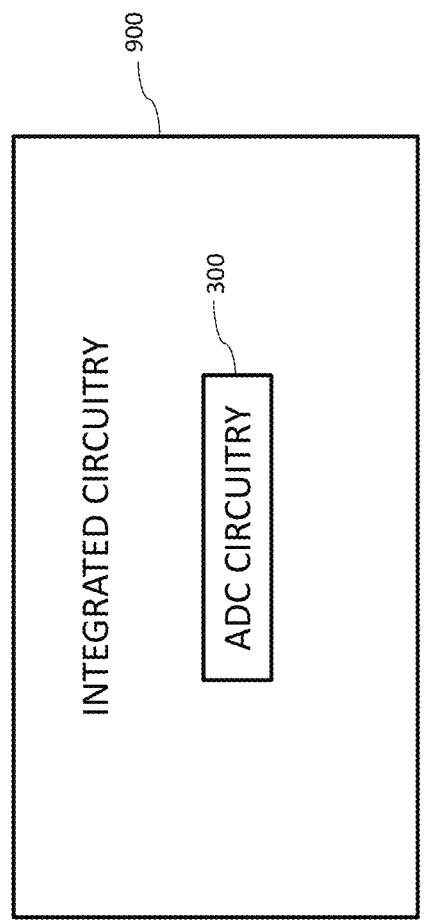
FIG. 10 is a schematic diagram of integrated circuitry incorporating the ADC circuitry embodying the present invention.

It will be appreciated that ADC circuitry 300, 500, 600 embodying the present invention, may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards. FIG. 10 illustrates ADC circuitry 300, 500, 600 implemented as integrated circuitry 900.

In any of the above aspects, the various features may be implemented in hardware, or as software modules running on one or more processors/computers.

The invention also provides a computer program or a computer program product comprising instructions which, when executed by a computer, cause the computer to carry out any of the methods/method steps described herein, and a non-transitory computer-readable medium comprising instructions which, when executed by a computer, cause the computer to carry out any of the methods/method steps described herein. A computer program embodying the invention may be stored on a non-transitory computer-readable medium, or it could, for example, be in the form of a signal such as a downloadable data signal provided from an Internet website, or it could be in any other form.

The present invention may be embodied in many different ways in the light of the above disclosure, within the spirit and scope of the appended claims.

The invention claimed is:

1. Analogue-to-digital converter, ADC, circuitry, comprising:
an analogue input terminal, operable to receive an analogue input voltage signal;
a comparator having first and second comparator-input terminals and operable to generate a comparison result based on a potential difference applied across those terminals; and
successive-approximation control circuitry configured to apply a potential difference across the first and second comparator-input terminals based upon the input voltage signal, and configured to control the potential difference for each of a series of successive approximation operations to cause the comparator to test in each successive approximation operation whether a magnitude of the analogue input voltage signal is bigger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation, the successive approximation operations configured such that the test value for a target one of the successive approximation operations between two other successive approximation operations of the successive approximation operations is, dependent on the comparison result generated by the comparator in each preceding approximation operation, an overvoltage test value whose magnitude is equal to or greater than a magnitude of a full-scale value defining a boundary of a full-scale range of the ADC circuitry,
wherein the successive-approximation control circuitry is configured, before carrying out all of the successive approximation operations, to:
determine, based on a combination of the comparison results of the target successive approximation operation and at least one preceding approximation operation, if the comparison result of the target successive approximation operation indicates that the magnitude of the analogue input voltage signal is outside said full-scale range.

2. The ADC circuitry according to claim 1, wherein:
the successive-approximation control circuitry is configured, if it is determined that the magnitude of the analogue input voltage signal is outside said full-scale range, to output an overvoltage signal indicating that the magnitude of the analogue input voltage signal is outside said full-scale range, optionally before carrying out subsequent successive approximation operations.

3. The ADC circuitry according to claim 1, comprising overvoltage circuitry configured to:
attenuate the analogue input voltage signal, optionally to below a maximum voltage threshold, if it is determined that the magnitude of the analogue input voltage signal is outside said full-scale range, and/or
isolate the analogue input voltage signal from the analogue input terminal if it is determined that the magnitude of the analogue input voltage signal is outside said full-scale range.

4. The ADC circuitry according to claim 1, wherein the difference amounts configured for the target successive approximation operation and the at least one preceding approximation operation are the same as one another.

5. The ADC circuitry according to claim 1, wherein the successive-approximation control circuitry is configured, before carrying out all of the successive approximation operations, to:
determine based on a combination of the comparison results of the target successive approximation operation and a plurality of preceding approximation operations, if the comparison result of the target successive approximation operation indicates that the magnitude of the analogue input voltage signal is outside said full-scale range.

6. The ADC circuitry according to claim 1, wherein:
the series of successive approximation operations comprises M successive approximation operations performed in a sequential order from a first successive approximation operation to a last successive approximation operation, where M is a positive integer, and
the target successive approximation operation is performed after a second successive approximation operation of the M successive approximation operations and/or before the second to last successive approximation operation of the M successive approximation operations.

7. The ADC circuitry according to claim 1, wherein:
the successive-approximation control circuitry is configured to determine if the comparison result of the target successive approximation operation indicates that the magnitude of the analogue input voltage signal is outside said full-scale range upon completion of the target successive approximation operation.

8. The ADC circuitry according to claim 1, wherein:
the successive-approximation control circuitry comprises a bit register configured to store logic states of N-bits, where N is a positive integer, each bit of the N-bits configured to store the comparison result of a corresponding successive approximation operation, and wherein the successive-approximation control circuitry is configured to:
upon completion of each successive approximation operation, update a logic state of the corresponding bit based on the corresponding comparison result.

9. The ADC circuitry according to claim 8, wherein:
the successive-approximation control circuitry comprises logic circuitry connected to bits of the bit register corresponding to the target successive approximation operation and the at least one preceding approximation operation, the logic circuitry configured to generate the overvoltage signal as a high logic output when the updated logic states of the bits corresponding to the target successive approximation operation and the at least one preceding approximation operation have predetermined values, or are the same as one another.

10. The ADC circuitry according to claim 1, wherein:
the comparator is configured to receive a reference voltage signal at the second comparator-input terminal, each successive approximation operation being dependent on a comparison result generated by the comparator of a comparison between:
the analogue input voltage signal, and
the reference voltage signal generated based on the preceding approximation operation.

11. An ADC comprising:
a plurality of sub-ADCs, each sub-ADC comprising the ADC circuitry according to claim 1; and
ADC overvoltage circuitry configured, if a given sub-ADC determines that the magnitude of its analogue input voltage signal is outside its full-scale range, to control at least one sub-ADC other than the given sub-ADC and/or the given sub-ADC.

12. The ADC according to claim 11, wherein the ADC overvoltage circuitry is configured to:
attenuate the analogue input voltage signal of the at least one sub-ADC other than the given sub-ADC and/or the given sub-ADC, if the given sub-ADC determines that the magnitude of its analogue input voltage signal is outside its full-scale range; and/or
isolate the analogue input voltage signal of the at least one sub-ADC other than the given sub-ADC from its analogue input terminal and/or the given sub-ADC from its analogue input terminal, if the given sub-ADC determines that the magnitude of its analogue input voltage signal is outside its full-scale range.

13. Integrated circuitry such as an IC chip comprising the ADC circuitry as claimed in claim 1.

14. A method of controlling analogue-to-digital converter, ADC, circuitry, the ADC circuitry comprising an analogue input terminal, operable to receive an analogue input voltage signal; a comparator having first and second comparator-input terminals and operable to generate a comparison result based on a potential difference applied across those terminals; and successive-approximation control circuitry configured to apply a potential difference across the first and second comparator-input terminals based upon the input voltage signal, and configured to control the potential difference for each of a series of successive approximation operations to cause the comparator to test in each successive approximation operation whether a magnitude of the analogue input voltage signal is bigger or smaller than a corresponding test value, the test value for each successive approximation operation being, dependent on a comparison result generated by the comparator in the preceding approximation operation, bigger or smaller than the test value for the preceding approximation operation by a difference amount configured for that successive approximation operation, wherein the test value for a target one of the successive approximation operations between two other successive approximation operations of the successive approximation operations is, dependent on the comparison result generated by the comparator in each preceding approximation operation, an overvoltage test value whose magnitude is equal to or greater than a magnitude of a full-scale value defining a boundary of a full-scale range of the ADC,
the method comprising:
before carrying out all of the successive approximation operations, determining, based on a combination of the comparison results of the target successive approximation operation and at least one preceding approximation operation, if the comparison result of the target successive approximation operation indicates that the magnitude of the analogue input voltage signal is outside said full-scale range.

\* \* \* \* \*